(12) United States Patent
Tsai et al.

(10) Patent No.: US 8,912,671 B2
(45) Date of Patent: Dec. 16, 2014

(54) SEMICONDUCTOR DEVICE HAVING ALIGNMENT MARK

(71) Applicants: Himax Technologies Limited, Tainan (TW); Himax Semiconductor, Inc., Tainan (TW)

(72) Inventors: Po-Yang Tsai, Tainan (TW); Chan-Liang Wu, Tainan (TW)

(73) Assignees: Himax Technologies Limited, Tainan (TW); Himax Semiconductor, Inc., Tainan (TW)

( * ) Notice: Subject to any disclaimer, the term of this patent is extended or adjusted under 35 U.S.C. 154(b) by 0 days.

(21) Appl. No.: 13/896,243

(22) Filed: May 16, 2013

(65) Prior Publication Data
US 2014/0339714 A1   Nov. 20, 2014

(51) Int. Cl.
G03F 9/00       (2006.01)
H01L 23/544    (2006.01)

(52) U.S. Cl.
CPC .................................... *H01L 23/544* (2013.01)
USPC .................. 257/797; 257/E23.011; 257/773; 257/774; 257/775

(58) Field of Classification Search
USPC .................. 257/773, 774, 775, E23.011, 797
See application file for complete search history.

(56) References Cited

U.S. PATENT DOCUMENTS

| 7,927,768 B2 * | 4/2011 | Fan et al. ......................... 430/5 |
| 8,278,761 B2 * | 10/2012 | Tsai et al. ...................... 257/773 |
| 2003/0104700 A1 * | 6/2003 | Fleming et al. ............... 438/694 |
| 2008/0231739 A1 * | 9/2008 | Takasaki et al. .............. 348/311 |

* cited by examiner

*Primary Examiner* — Alexander Oscar Williams
(74) *Attorney, Agent, or Firm* — J.C. Patents

(57) ABSTRACT

A semiconductor device including a substrate and at least one alignment mark disposed on the substrate and having at least one hollow pattern. Therefore, the identification rate of the alignment mark can be high by the hollow pattern.

13 Claims, 8 Drawing Sheets

SEMICONDUCTOR DEVICE HAVING ALIGNMENT MARK

TECHNICAL FIELD

The disclosure relates to a semiconductor device, and particularly relates to a semiconductor device comprising an alignment mark.

BACKGROUND

A semiconductor device, such as a chip, is an electrical device integrating many conductive layers. The semiconductor device usually has an alignment mark in a top conductive layer for being aligning with other instruments (for example, a carrier in a tape carrier package process). However, in the conventional semiconductor device, there must be nothing under the alignment mark for avoiding that the identification rate of the alignment mark is influenced. A region of the semiconductor device must be reserved for the layout of the alignment mark, such that the layout of the circuit layer is limited. As a result, the region of the semiconductor device corresponding to the alignment mark can't be used, and the cost of the semiconductor device can't be reduced further.

SUMMARY

The disclosure provides a semiconductor device, and the identification rate of an alignment mark thereof is enhanced.

An embodiment of the disclosure provides a semiconductor device including a substrate and at least one alignment mark disposed on the substrate and having at least one hollow pattern.

In an embodiment of the disclosure, the substrate has a circuit region and a peripheral region outside of the circuit region, and the alignment mark is disposed in a reservation region of the circuit region In an embodiment of the disclosure, the reservation region is in a corner of the circuit region.

In an embodiment of the disclosure, the alignment mark is formed by a first metal layer disposed on the substrate.

In an embodiment of the disclosure, the semiconductor device comprises at least one trace. The trace is formed by at least one second metal layer and passes through the alignment mark. The second metal layer is disposed between the first metal layer and the substrate.

In an embodiment of the disclosure, the trace is filled in the reservation region.

In an embodiment of the disclosure, the trace is a line.

In an embodiment of the disclosure, the hollow pattern comprises a plurality of sub hollow patterns, and the sub hollow patterns are substantially the same.

In an embodiment of the disclosure, each of the sub hollow patterns has at least one space, and a dimension of the space is smaller than a dimension of each of the sub hollow patterns.

In an embodiment of the disclosure, each of the sub hollow patterns includes a center pattern and four peripheral patterns surrounding the center pattern, the center pattern has a through hole and is separated from the four peripheral patterns, and the four peripheral patterns are separated from each other.

In an embodiment of the disclosure, each of the sub hollow patterns includes a T-shape pattern, a 1-shape pattern and a L-shape pattern. The T-shape pattern, the 1-shape pattern and the L-shape pattern are separated from each other.

In an embodiment of the disclosure, the at least one hollow pattern is separated from each other.

In an embodiment of the disclosure, the shape of the at least one hollow pattern is a cross or a square.

In view of the foregoing, in the semiconductor device according to an embodiment of the disclosure, the identification rate of the alignment mark can be enhanced by the hollow pattern, because the hollow pattern causes the optical variation of the alignment mark is sharper.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
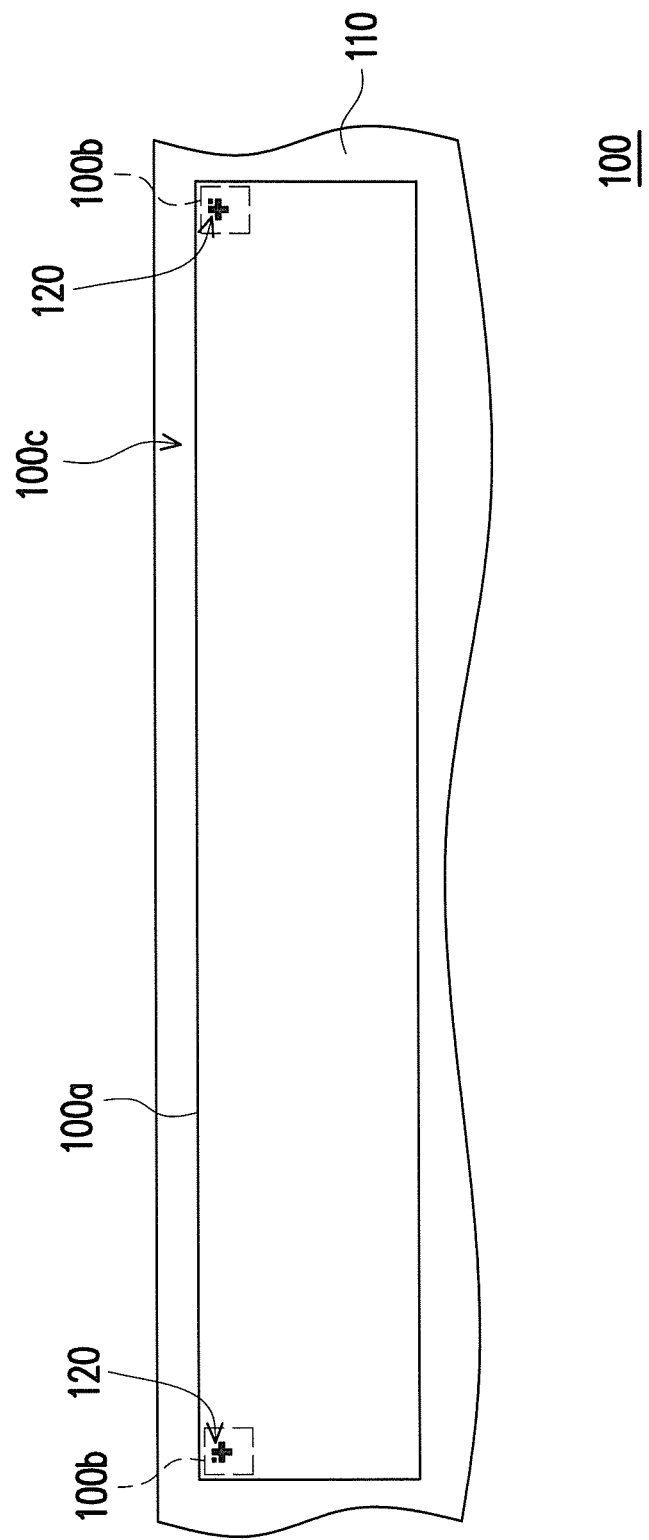
FIG. 1 is a top view of a semiconductor device according to one embodiment of the present invention.
Figure 2:
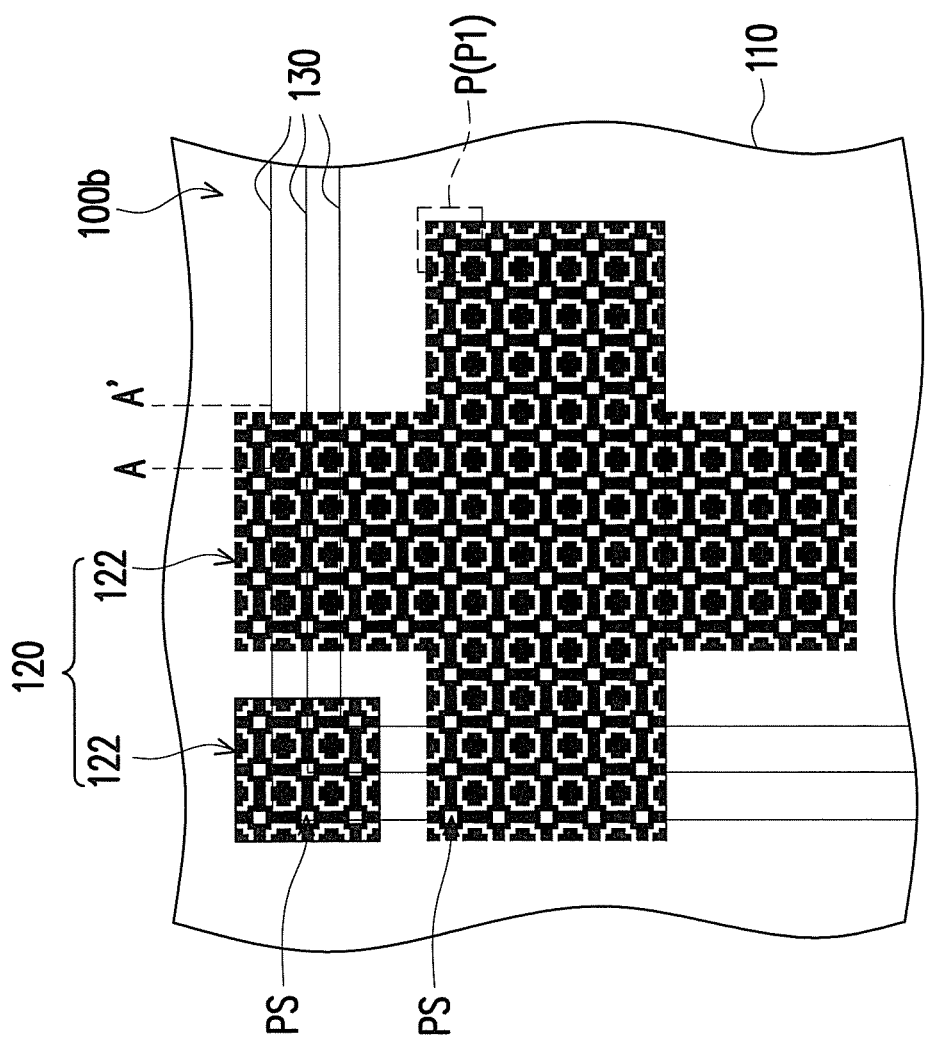
FIG. 2 is an enlarged view of a region of the semiconductor device in FIG. 1.
Figure 3:
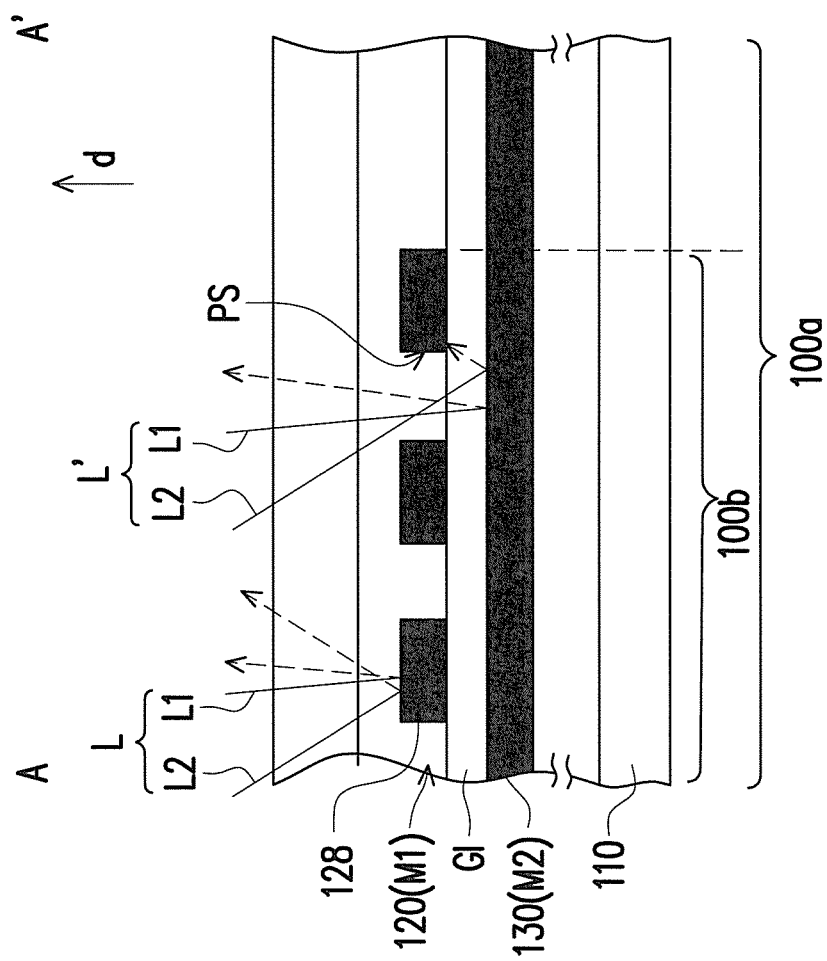
FIG. 3 is a cross-sectional view of the semiconductor device along a section line A-A' of FIG. 2.

FIG. 1 is a top view of a semiconductor device according to one embodiment of the present invention. FIG. 2 is an enlarged view of a region of the semiconductor device in FIG. 1. FIG. 3 is a cross-sectional view of the semiconductor device along a section line A-A' of FIG. 2. Referring to FIG. 1, FIG. 2 and FIG. 3, a semiconductor device 100 includes a substrate 110 and at least one alignment mark 120 disposed on the substrate 110. In the present embodiment, the substrate 110 has a circuit region 100a and a peripheral region 100c outside of the circuit region 100a. The alignment mark 120 may be disposed in a reservation region 100b of the circuit region 100a. In the present embodiment, the substrate 110 is, for example, a wafer. However, the present invention is not limited thereto.

In detail, as shown in FIG. 1, the reservation region 100b may be in a corner of the circuit region 100a. The semiconductor device 100 of the present embodiment may include two alignment marks 120. The two alignment marks 120 may be respectively disposed in a reservation region 100b and another reservation region 100b respectively located in the upper-left corner and the upper-right corner of the circuit region 100a. However, the present invention is not limited thereto. The number and the location of the alignment mark 120 and the reservation region 100b can be depended on a real demand.

Referring to FIG. 2 and FIG. 3, it should be noted that the alignment mark 120 has at least one hollow pattern 122. The identification rate of the alignment mark 120 can be enhanced by the hollow pattern 122, because the hollow pattern 122 causes the optical variation of the alignment mark 120 is sharper than the conventional alignment mark which is solid. In the present embodiment, as shown in FIG. 2, the alignment mark 120 may include two hollow patterns 122 separated from each other. The shape of one of the hollow patterns 122 may be a cross, and the shape of another of the hollow patterns 122 may be a square. The square may be disposed beside a intersection of the cross. However, the present invention is not limited thereto. In other embodiments, shapes and relative locations of the hollow patterns 122 can be depended on a real demand.

Figure 4:
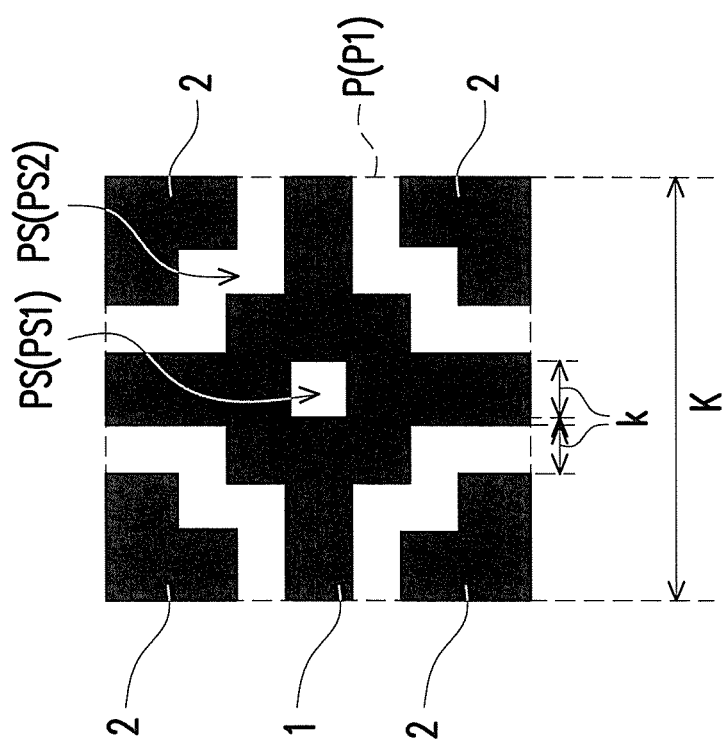
FIG. 4 is an enlarged view of a sub hollow pattern in FIG. 2.

In the present embodiment, the hollow pattern 122 may include a plurality of sub hollow patterns P, and the sub hollow patterns P may be substantially the same. For example, as shown in FIG. 2, the hollow pattern 122 may include a plurality of sub hollow patterns P1. FIG. 4 is an enlarged view of a sub hollow pattern in FIG. 2. Referring to FIG. 4, each of the sub hollow patterns P(P1) has at least one space PS, and a dimension k of the space PS is smaller than a dimension K of each of the sub hollow patterns P(P1).

Moreover, in the present embodiment, each of the sub hollow patterns P includes a center pattern 1 and four peripheral patterns 2 surrounding the center pattern 1. The center pattern 1 has a through hole, such as space PS1, and is separated from the four peripheral patterns 2. The four peripheral patterns 2 are separated from each other. The shape of the space PS (PS1) can be a square. The shape of the space PS (PS2) can be a W-shape. However, the present invention is not limited thereto. The sub hollow patterns P can be other types. The other type sub hollow patterns are described below by taking the patterns in FIG. 5~FIG. 8 as examples.

Figure 5:
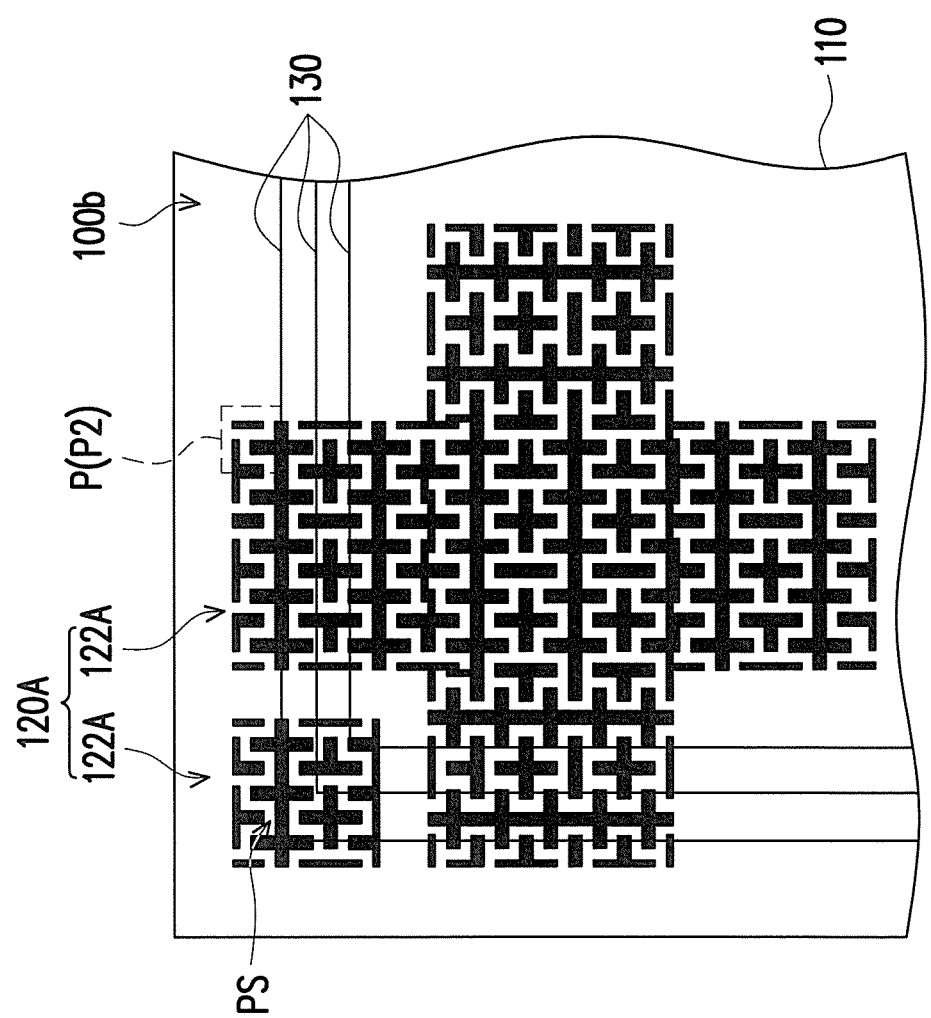
FIG. 5 illustrates an alignment mark according to another embodiment of the present invention.
Figure 6:
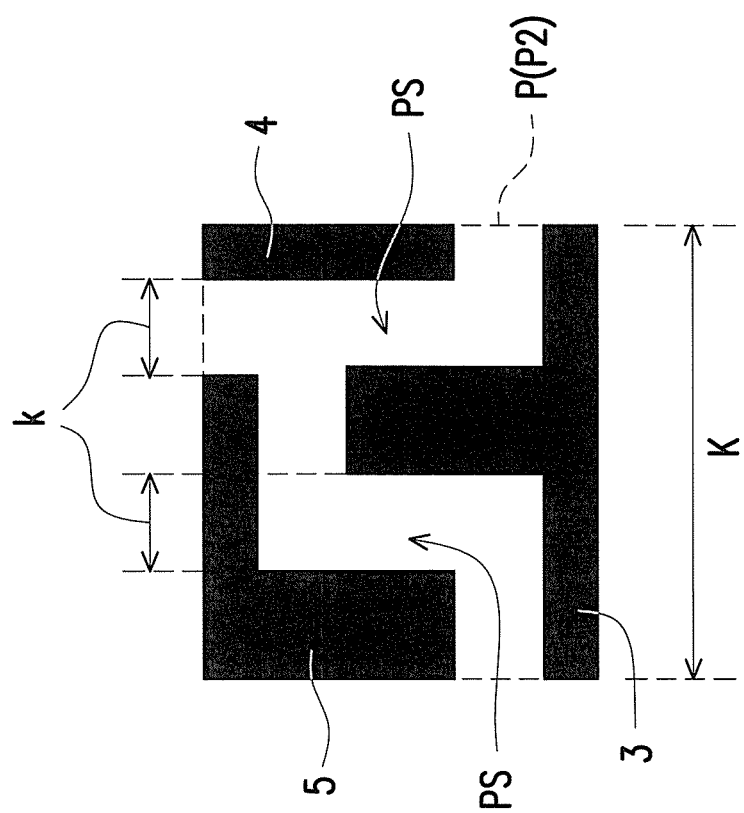
FIG. 6 is an enlarged view of a sub hollow pattern in FIG. 5.

FIG. 5 illustrates an alignment mark according to another embodiment of the present invention. FIG. 6 is an enlarged view of a sub hollow pattern in FIG. 5. The elements in FIG. 5 and FIG. 6 are similar to the corresponding elements in FIG. 2 and FIG. 4, and the symbols of the elements in FIG. 5 and FIG. 6 are corresponding or the same to the symbols of the elements in FIG. 2 and FIG. 4. Referring to FIG. 5 and FIG. 6, the alignment mark 120A has at least one hollow pattern 122A. The hollow pattern 122A includes a plurality of sub hollow patterns P (P2), and the sub hollow patterns P (P2) are substantially the same. Referring to FIG. 6, each of the sub hollow patterns P (P2) includes a T-shape pattern 3, a 1-shape pattern 4 and a L-shape pattern 5. The T-shape pattern 3, the 1-shape pattern 4 and the L-shape pattern 5 are separated from each other.

Figure 7:
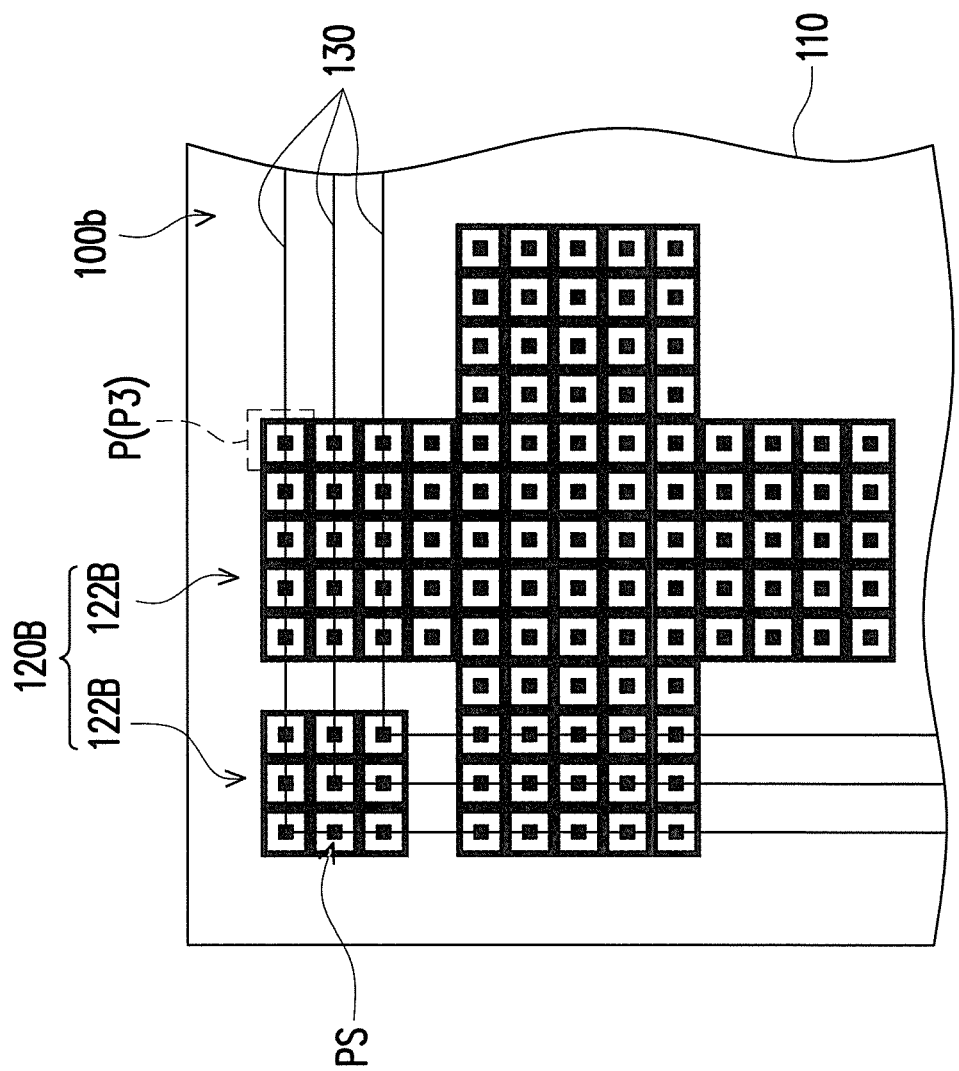
FIG. 7 illustrates an alignment mark according to another embodiment of the present invention.
Figure 8:
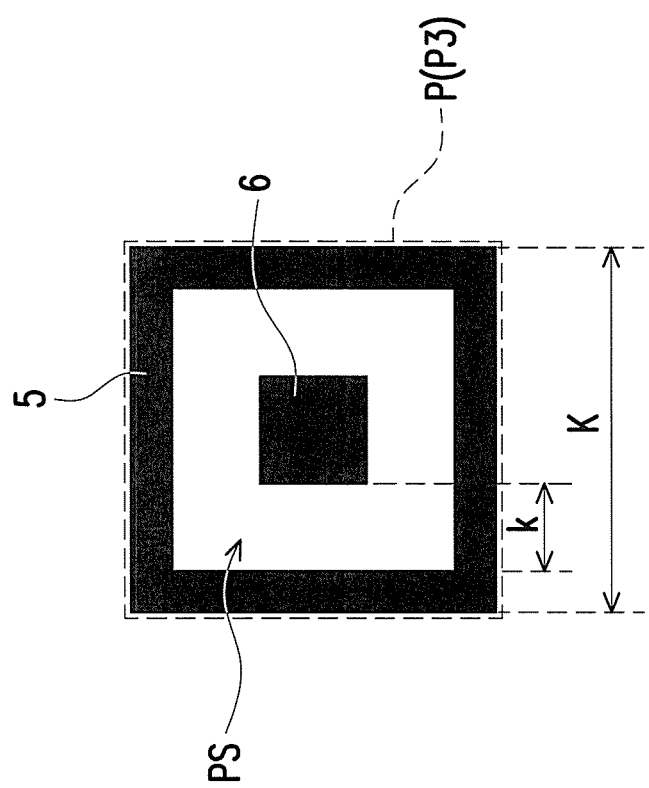
FIG. 8 is an enlarged view of a sub hollow pattern in FIG. 7.

FIG. 7 illustrates an alignment mark according to another embodiment of the present invention. FIG. 8 is an enlarged view of a sub hollow pattern in FIG. 7. The elements in FIG. 7 and FIG. 8 are similar to the corresponding elements in FIG. 2 and FIG. 4, and the symbols of the elements in FIG. 7 and FIG. 8 are corresponding or the same to the symbols of the elements in FIG. 2 and FIG. 4. Referring to FIG. 7 and FIG. 8, the alignment mark 120B has at least one hollow pattern 122B. The hollow pattern 122B includes a plurality of sub hollow patterns P (P3), and the sub hollow patterns P (P3) are substantially the same. Referring to FIG. 8, each of the sub hollow patterns P (P3) includes a square frame 5 and a square 6 disposed in the square frame. The square frame 5 surrounds and separates from the square 6.

Referring to FIG. 2 and FIG. 3 again, the alignment mark 120 is formed by a first metal layer M1 disposed on the substrate 110. The semiconductor device 100 further includes at least one trace 130 formed by at least one second metal layer M2. The second metal layer M2 is disposed between the first metal layer M1 and the substrate 110. An insulation layer GI is disposed between the first metal layer M1 and the second metal layer M2. In the present embodiment, the trace 130 may pass through the alignment mark 120. In other words, the trace 130 may overlap with the alignment mark 120 in the direction d perpendicular to the substrate 110. The trace 130 may be filled in the reservation region 100b, and the trace 130 may be a line. However, the present invention is not limited thereto. In other embodiments, the trace 130 may be other patterns.

It should be noted that when the trace 130 passes through the alignment mark 120, the identification rate of the alignment mark 120 can be still high by the hollow pattern 122. In detail, as shown in FIG. 3, all of a detection light L transmitted toward a solid portion 128 of the alignment mark 120 can be reflected. But, only a portion L1 of a detection light L' transmitted toward the space PS of the hollow pattern 122 can be reflected by the trace 130. Namely, the light reflection amount from the solid portion 128 and the light reflection amount from the space PS can be different. As a result, the contrast of the alignment mark 120 including the hollow pattern 122 having the space PS is still enough, such that the alignment mark 120 can still be recognized by an alignment machine. Namely, the region 100b of the semiconductor device 100 corresponding to the alignment mark 120 can be used by the trace 130, and the cost of the semiconductor device 100 can be reduced further.

In view of the foregoing, in one embodiment of the present invention, the identification rate of the alignment mark can be high by the hollow pattern. Moreover, the trace can pass through the alignment mark, because the identification rate of the alignment mark can be still high by the hollow pattern. As a result, the region of the semiconductor device corresponding to the alignment mark can be used by the trace, and the cost of the semiconductor device can be reduced further.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor device, comprising:
    a substrate; and
    at least one alignment mark disposed on the substrate and having at least one hollow pattern, wherein the at least one hollow pattern comprises a plurality of sub hollow patterns, and the sub hollow patterns are substantially the same.

2. The semiconductor device as claimed in claim 1, wherein the substrate having a circuit region and a peripheral region outside of the circuit region, and the alignment mark is disposed in a reservation region of the circuit region.

3. The semiconductor device as claimed in claim 2, wherein the reservation region is in a corner of the circuit region.

4. The semiconductor device as claimed in claim 1, wherein the at least one alignment mark is formed by a first metal layer disposed on the substrate.

5. The semiconductor device as claimed in claim 4, further comprising at least one trace formed by at least one second metal layer passes through the alignment mark, wherein the at least one second metal layer is disposed between the first metal layer and the substrate.

6. The semiconductor device as claimed in claim 5, wherein the trace is filled in the reservation region.

7. The semiconductor device as claimed in claim 5, wherein the trace is a line.

8. The semiconductor device as claimed in claim 1, wherein each of the sub hollow patterns having at least one space, and a dimension of the space is smaller than a dimension of each of the sub hollow patterns.

9. The semiconductor device as claimed in claim 1, wherein each of the sub hollow patterns comprises a center pattern and four peripheral patterns surrounding the center pattern, the center pattern has a through hole and is separated from the four peripheral patterns, and the four peripheral patterns are separated from each other.

10. The semiconductor device as claimed in claim 1, wherein each of the sub hollow patterns comprises a T-shape pattern, a 1-shape pattern and a L-shape pattern, the T-shape pattern, the 1-shape pattern and the L-shape pattern are separated from each other.

11. The semiconductor device as claimed in claim 1, wherein each of the sub hollow patterns comprises a square frame and a square disposed in the square frame.

12. The semiconductor device as claimed in claim 1, wherein the at least one hollow pattern is separated from each other.

13. The semiconductor device as claimed in claim 12, wherein the shape of the at least one hollow pattern is a cross or a square.

* * * * *